United States Patent [19]

Yost et al.

[11] Patent Number: 5,010,558
[45] Date of Patent: Apr. 23, 1991

[54] DATA OVERLAP DECODER

[75] Inventors: Richard A. Yost, West Melbourne; David H. Damerow, Palm Bay, both of Fla.

[73] Assignee: Harris Corporation, Melbourne, Fla.

[21] Appl. No.: 250,697

[22] Filed: Sep. 29, 1988

[51] Int. Cl.$^5$ .......................... H04L 27/00; H04B 1/10
[52] U.S. Cl. ........................................ 375/37; 371/43; 375/102
[58] Field of Search ...................... 375/18, 37, 38, 94, 375/101, 102, 118; 371/43; 340/146.2; 364/728.01, 724.12

[56] References Cited

U.S. PATENT DOCUMENTS 4,879,720 11/1989 Shumate et al. ................... 371/43

Primary Examiner—Benedict V. Safourek
Assistant Examiner—Marianne Huseman
Attorney, Agent, or Firm—Evenson, Wands, Edwards, Lenahan & McKeown

[57] ABSTRACT

A decoding signal processing mechanism preserves the use of a single high data rate encoder at a transmitter site, so that the input data may be continuously encoded and transmitted, while using multiple low data rate decoders at the receiver site in such a manner that "end effects" are avoided and the performance of high data rate decoding is attained. At the transmitter site, digital information signals are encoded at a first encoding rate and then transmitted over a communication channel to a receiver site. At the receiver site signals to be decoded are coupled to a respective one of a plurality of decoders which decode, at a second rate less than said first, encoding rate, respective overlapping blocks of received encoded digital information signals and derive respective portions of the digital information signals. The decoded outputs of the decoders are combined to recover the digital information signals. To accommodate overlapping blocks of encoded information signals each decoder includes a buffer delay (memory) for storing a respective sequential overlapping portion of the received encoded information signal. By controlling the storage of a respective portion of the encoded signals through its buffer delay, each decoder can effectively operate on a portion of the encoded signals that permits downstream reassembly of the original information signals without anomolies at the signal interface of successive decoded segments of the information signals.

10 Claims, 5 Drawing Sheets

DATA OVERLAP DECODER

FIELD OF THE INVENTION

The present invention relates in general to communication systems and is particularly directed to a method and apparatus for decoding, at a received site, digital information signals that have been encoded in accordance with a forward error correction encoding mechanism at a transmitter site, by means of decoders the signal processing speed of which is considerably lower than the encoding rate employed at the transmitter site.

BACKGROUND OF THE INVENTION

High data rate decoding of forward error correction-encoded digital information signals is limited primarily by the signal processing speed of available decoder hardware. In particular, in an airborne/spacecraft environment, wherein payload and occupancy constraints limit the size of the signal processing resources that may be installed in the vehicle, the freedom to simply add another circuit board of signal processing components in order to obtain the requisite signal processing capacity/speed is effectively non-existent. Consequently, the system designer is often forced to employ an error correction encoding mechanism (such as block coding approach), the execution of which is less hardware intensive than a higher performance scheme and which, unfortunately, suffers when compared to a (preferred) convolutional coding technique.

One proposal to increase the speed of high performance/high speed signal processors used for high data rate encoding and decoding of convolutional code-based forward error correction schemes has been to separate or divide the encoder (at the transmitter site) and the decoder (at the receiver site) into respective pluralities of lower data rate signal processors that operate, in parallel, on subdivided portions of the data stream. Namely, at the transmitter site, the data stream is separated (demultiplexed) into a plurality of individual portions that are separately encoded by the lower data rate encoders and then recombined for transmission over the communication channel. At the receiver site, the encoded data stream is once again separated into a plurality of signal paths containing low data rate decoders, which decode the respective segments of the encoded data stream. These decoded segments are then multiplexed into an output data stream that is intended to replicate the original information signals.

Because of the use of lower data rate encoder/decoding mechanisms, the sought-after error correction capabilities provided by convolutional codes can be employed. Unfortunately, however, this approach requires a substantial increase in hardware at the transmitter site (multiple encoders).

SUMMARY OF THE INVENTION

In accordance with the present invention, the hardware and performance limitations of conventional high data rate forward error correction code encoding/decoding signal processing systems are reduced by a signal processing mechanism that preserves the use of a high data rate encoder at the transmitter site, so that the input data may be continuously encoded and transmitted, while using low data rate decoders at the receiver site in such a manner that "end effects" are avoided and the sought-after performance of high data rate decoding is attained.

For this purpose, the present invention employs, at the transmitter site, an encoder through which digital information signals are encoded at a first encoding rate and then transmitted over a communication channel to a receiver site, whereat encoded digital information signals that have been transmitted over the communication channel from the transmitter site are received. At the receiver site, the received encoded serial data stream is demultiplexed, in sequential overlapping blocks, to a plurality of decoding signal processors. Each decoder decodes, at a second rate, less than said first encoding rate, a respective overlapping block of received encoded digital information signals and derives therefrom a respective portion of the digital information signals. The decoded outputs of the decoding signal processors are then combined with one another, so as to recover the digital information signals. To accommodate overlapping blocks of encoded information signals and the lower decoding rate, each decoder includes input and output buffers, respectively upstream and downstream of a lower data rate decoder. Through the use of the input buffer, the length of the encoded data block that is processed by the lower data rate decoder can be controlled to be of sufficient capacity to prevent the output of the decoder from containing anomolies at the boundaries of the decoded data block signal block. The timing of the readout of the decoded data contents of the output buffer is governed by the recovered clock in such a manner that nonoverlapping blocks of original information signals are serially produced.

DETAILED DESCRIPTION

Figure 1:
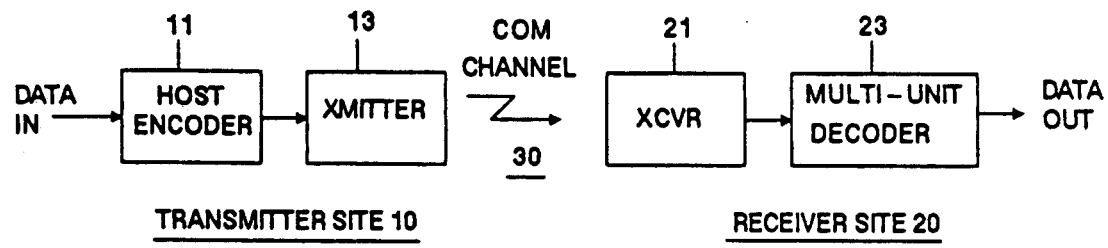
FIG. 1 diagrammatically illustrates a communication system incorporating the error correction encoding and decoding mechanism in accordance with the present invention.

Before describing in detail the particular improved data overlap decoding mechanism in accordance with the present invention, it should be observed that the present invention resides primarily in a novel structural combination of conventional signal processing and communication circuits and components and not in the particular detailed configurations thereof. Accordingly, the structure, control and arrangement of these conventional circuits and components have been illustrated in the drawings by readily understandable block diagrams which show only those specific details that are pertinent to the present invention, so as not to obscure the disclosure with structural details which will be readily apparent to those skilled in the art having the benefit of the description herein. Thus, the block diagram illustrations of the Figures do not necessarily represent the mechanical structural arrangement of the exemplary system, but are primarily intended to illustrate the major structural components of the system in a convenient functional grouping, whereby the present invention may be more readily understood.

Referring now to FIG. 1 of the drawings, there is diagrammatically illustrated a communication system comprised of a transmitter site 10, a receiver site 20 and a communication channel 30 that links the transmitter site with the receiver site. At the transmitter site a serial input digital data stream from a digital information source (not shown) is applied to a host encoder 11 which subjects the original data stream to an encoding mechanism, (such as a convolutional encoding mechanism) that will enable the receiver site to correct errors that have occurred in the course of data transmission over the channel. For this purpose, encoder 11 may comprise a rate one-half, constraint length seven convolutional code encoder operating at 150 Mbps. The resulting encoded data signal is applied to a transmitter 13, such as a quadrature phase shift keying modulator operating in the satellite frequency and which modulates the encoded signal and transmits the encoded signal over information channel 30 to receiver site 20.

At the receiver site, incoming signals from channel 30 are demodulated by a receiver 21 and applied therefrom to a multi-decoder unit 23 (to be described in detail below with reference to FIGS. 3–6) which contains a plurality of decoding signal processors that operate on overlapping blocks of encoded data at a signal processing rate considerably lower than that employed by the host encoder at the transmitter site and produce decoded segments of the data stream which are then reassembled to recover the original information signals.

Figure 2:
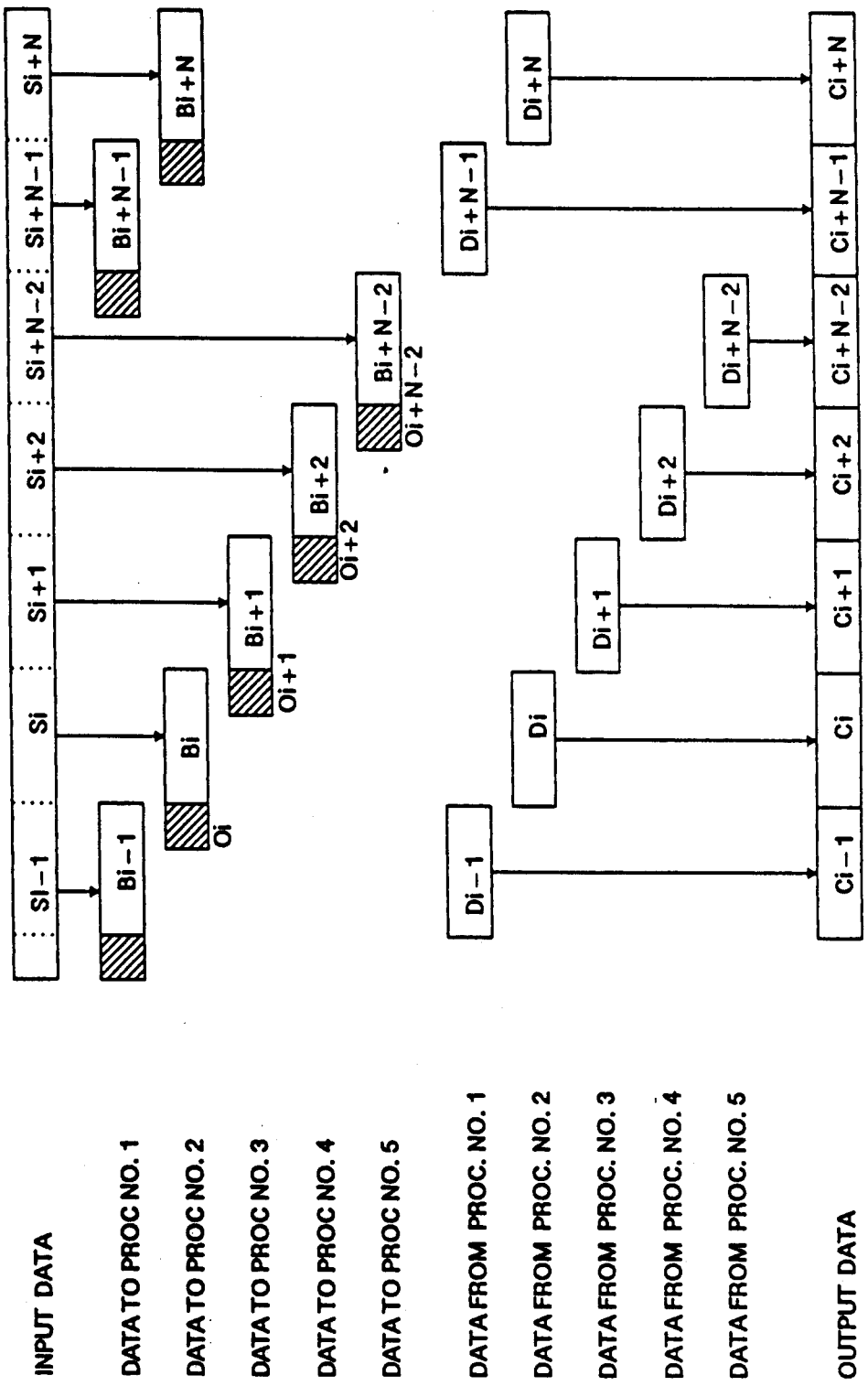
FIG. 2 shows the format of an encoded serial data stream output by the receiver of the communication system of FIG. 1.

In order to facilitate an appreciation of the signal processing architecture of the receiver's multidecoder unit, it is useful to examine the manner in which the decoder unit operates on the encoded serial data stream at the output of the receiver demodulator to extract and process successive overlapping blocks of the encoded data in order to recover the original information. Specifically, as shown in FIG. 2, the encoded serial data stream output by the receiver 21 may be considered to be comprised of a sequence of contiguous segments of encoded data ... $Si-1$ ... $Si$ ... $Si+1$ ... $Si+2$ ... etc., each of which has been encoded by encoder 11 at the transmitter site at a relatively high encoding rate, as described above. Pursuant to the invention, the multi-decoder unit at the receiver disassembles the incoming encoded data stream into a plurality of sequentially overlapping blocks of data ... $Bi-1$ ... $Bi$ ... $Bi+1$ ... $Bi+2$ ... etc., such that each block of encoded data includes a portion of the contents of an immediately preceding block of data. In other words, taking block $Bi$ as an example, the initial portion of a block of data $Bi$ effectively overlaps immediately preceding data block $Bi-1$, by some prescribed portion $Oi$. Each block of data $B$ is then decoded in a respective decoder $D$ to produce an output data component $C$ that is combined with the output data components produced by other decoders within the decoder unit, so as to obtain a sequence of contiguous output data components $Ci-1$ ... $Ci$ ... $Ci+1$ ... $Ci+2$ ... etc. corresponding to the original serial data stream prior to its application to encoder 11 at the transmitter site. The decoding and reassembly mechanism executed by the multiplicity of signal decoding processors is such that the contiguous components of the output data stream contain no redundant data and omit none of the original data.

Figure 3:
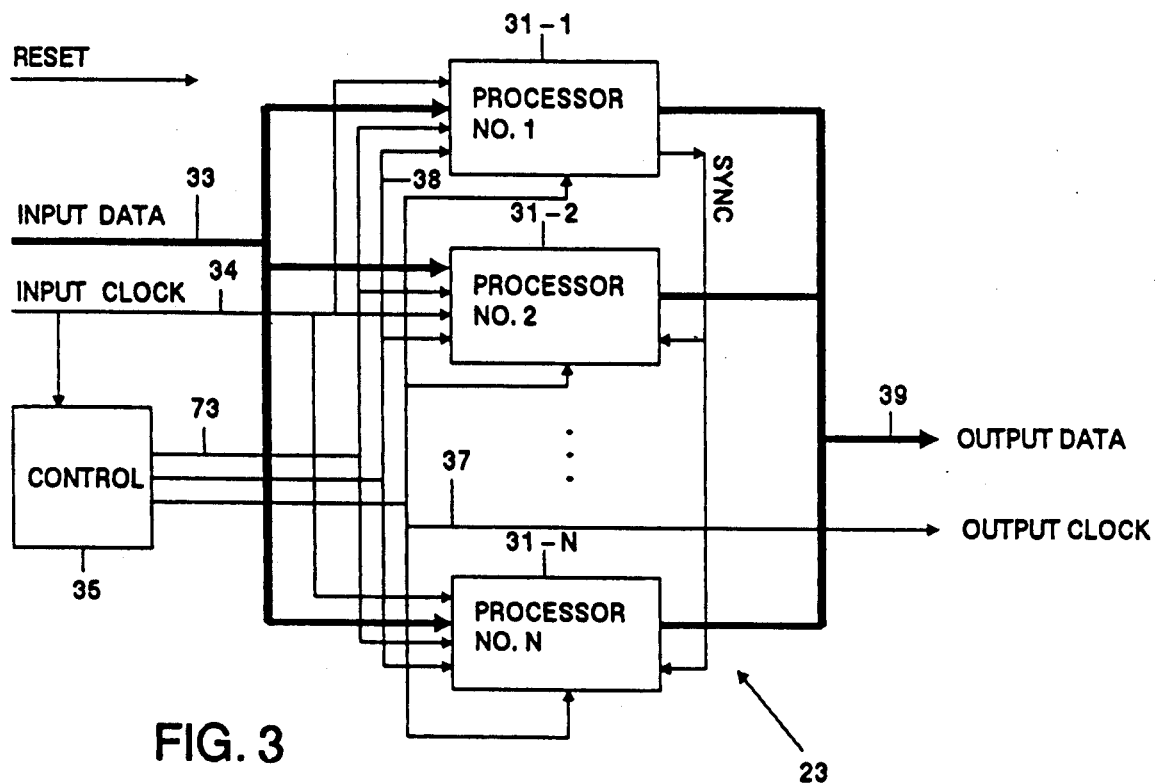
FIG. 3 diagrammatically illustrates a multi-decoder unit for carrying out the overlap-decoding and recovery process in accordance with the present invention.

Referring now to FIG. 3, the multi-decoder unit for carrying out the above-described overlap-decoding and recovery process in accordance with the present invention is diagrammatically shown as comprising a plurality of decoder signal processors $31-1$ ... $31-N$ (to be described below with reference to FIG. 4), each of which is coupled to an output link 33 from receiver 21 and operates under the control of a control unit 35 (to be described below with reference to FIG. 6) to decode a respective portion of the received encoded digital data stream that overlaps an immediately preceding portion of the encoded data stream, as diagrammatically illustrated in FIG. 2, described supra. Also applied from the receiver to the decoder signal processors of the multi-decoder unit is the recovered clock signal, for synchronizing the operation of the control unit and the respective signal processors with the encoded serial data stream. Control unit 35, in turn, generates a decoding clock signal over link 37, an output clock over link 73, and a set of control signals over control link 38 for selectively enabling each of decoder signal processors $31-1$ ... $31-N$ in the course of the decoding of the overlapping blocks of data and the recovery of the original information signals. The reassembled output data stream comprised of contiguous decoded data components C is output over output data link 39.

Figure 4:
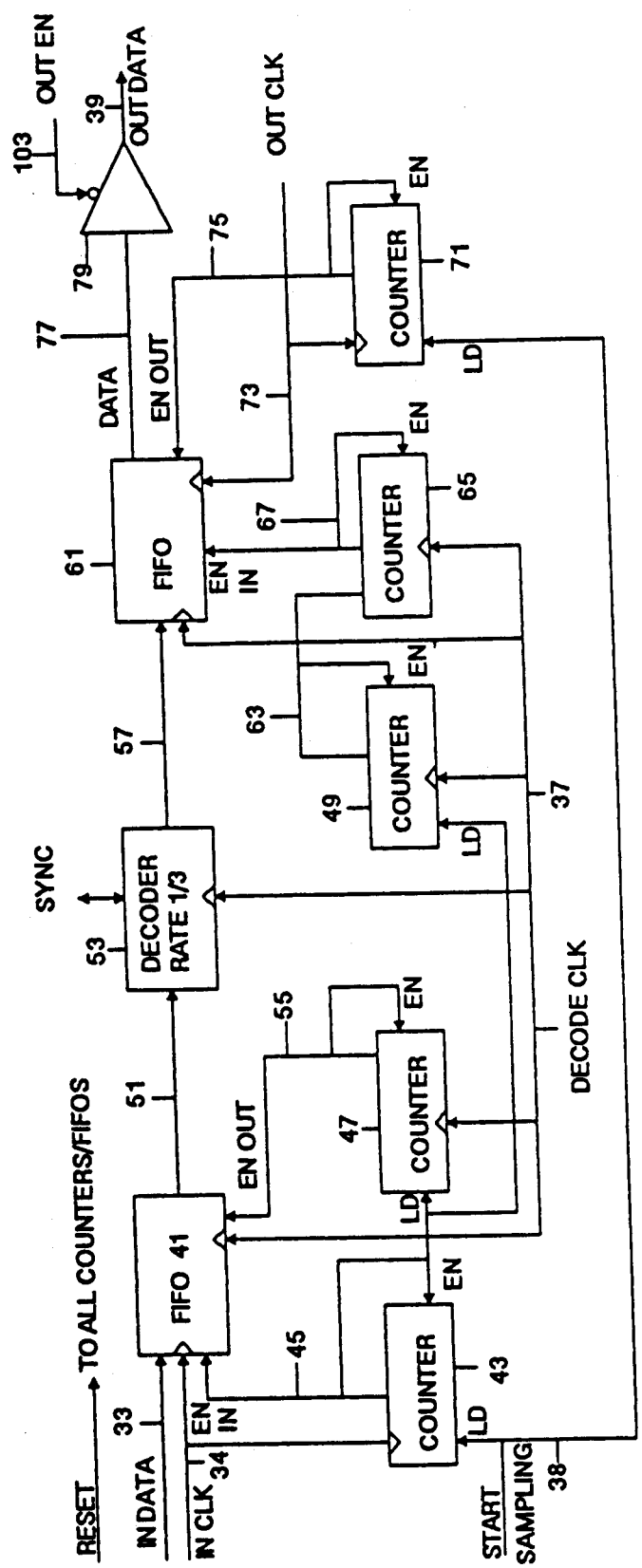
FIG. 4! diagrammatically shows the configuration of an individual decoding signal processor.

Referring now to FIG. 4 the configuration of an individual decoder signal processor 31 is diagrammatically shown as comprising an input buffer 41 having a data input coupled to data link 33 and a clock input coupled to the recovered clock link 34 from the output of the receiver 21. Input buffer 41 may comprise a first-in/first-out memory (FIFO) the storage capacity of which corresponds to the size of a block of encoded data B, shown in FIG. 2. Input buffer 41 has a load enable input coupled to an input storage control counter 43, the contents of which are incremented by input clock signals supplied over recovered clock link 34 from an initial prescribed value. Counter 43 is preset at this initial value in response to a load input signal from control unit 35 supplied over link 38. Once enabled, counter 43 counts up to its terminal or capacity value and rolls over, supplying an output signal over link 45 to the enable input of buffer 41. During the counting, the input buffer 41 is enabled to clock in the data. This output signal is also fed back to disable the counter and the input buffer 41, and further supplied to the load inputs of a decoder input control counter 47 and a decoder output control counter 49.

Decoder input control counter 47 serves to control the transfer of the contents of input buffer 41 over a link 51 to a decoder 53. For this purpose, counter 47 is incremented by a decoding clock supplied from control unit 35 over clock link 37 from an initial preset value in response to a load input signal generated by counter 43, when counter 43 reaches its terminal count. During the incrementing of counter 47, the output of counter on link 55 enables FIFO buffer 41. Counter 47 counts up to its terminal or capacity value and rolls over. Its output signal on link 55 is fed back to disable counter 47.

As mentioned previously, the decoding rate of an individual decoder signal processor 31 is considerably less than the encoding rate of host encoder 11 at the transmitter site, and this decoding rate is controlled at the receiver site by the lower frequency of the clock supplied over link 37 to each of buffers 41, 61, counters 47, 49, 65 and decoder 53. Thus, counter 43 runs off the recovered encoded data clock supplied over link 34, so as to load a block of data into buffer 41, while counter 47 is controlled to read out the buffered data into the decoder at the lower decoding clock rate supplied over link 37.

As the data is decoded it is output from decoder 53 over link 57 into an output buffer 61. Like input buffer 41, output buffer 61 may comprise a FIFO, the contents of which are controllably clocked out to an output data link 39. The loading of output buffer 61 with a decoded data component produced by decoder 53 is controlled by a pair of cascaded decoder output control counters 49 and 65 which are incremented by the decoding clock supplied from control unit 35 over clock link 37 from respective initial preset values. Counter 49 begins counting decoding clock signals from an initial value in response to a load input signal generated by counter 43 when counter 43 reaches its terminal count. Once enabled, counter 49 counts up to its terminal or capacity value and rolls over, supplying an output signal over link 63 to the load or preset input of a further counter 65. This output signal is also fed back to disable counter 49. At the same time counter 65 begins counting decoding clock signals from an initial value preset by the load enable input produced by counter 49. During this time counter 65 provides an enable input to decoder output buffer 61. With buffer 61 now enabled it begins to receive and store the decoded output data supplied by decoder 53 under the control of the decoder clock on link 37. Upon reaching its terminal count counter 65 is disabled via link 67, and also supplies a disable input to buffer 61, to prevent the further clocking in of decoded data signals on link 57.

The reading out of the contents of buffer 61 is controlled by a further counter 71 which counts up from a preset value under the control of a decoded data read-out clock on link 73 from control unit 35 to its terminal value and then disables itself via link 75. Link 75 is also coupled to the output enable port of output buffer 61. During the successive incrementing of counter 71 by output data clock signal on link 73, the state of link 75 is such that the reading out of the contents of buffer 61 is enabled so that the contents of buffer 61 may be read out at the output data clock rate and supplied over link 77 via an output driver 79 to output link 39. Upon reaching its terminal count, the output of counter 71 on link 75 changes state, thereby disabling both counter 71 and the reading out of decoded data from buffer 61.

Figure 5:
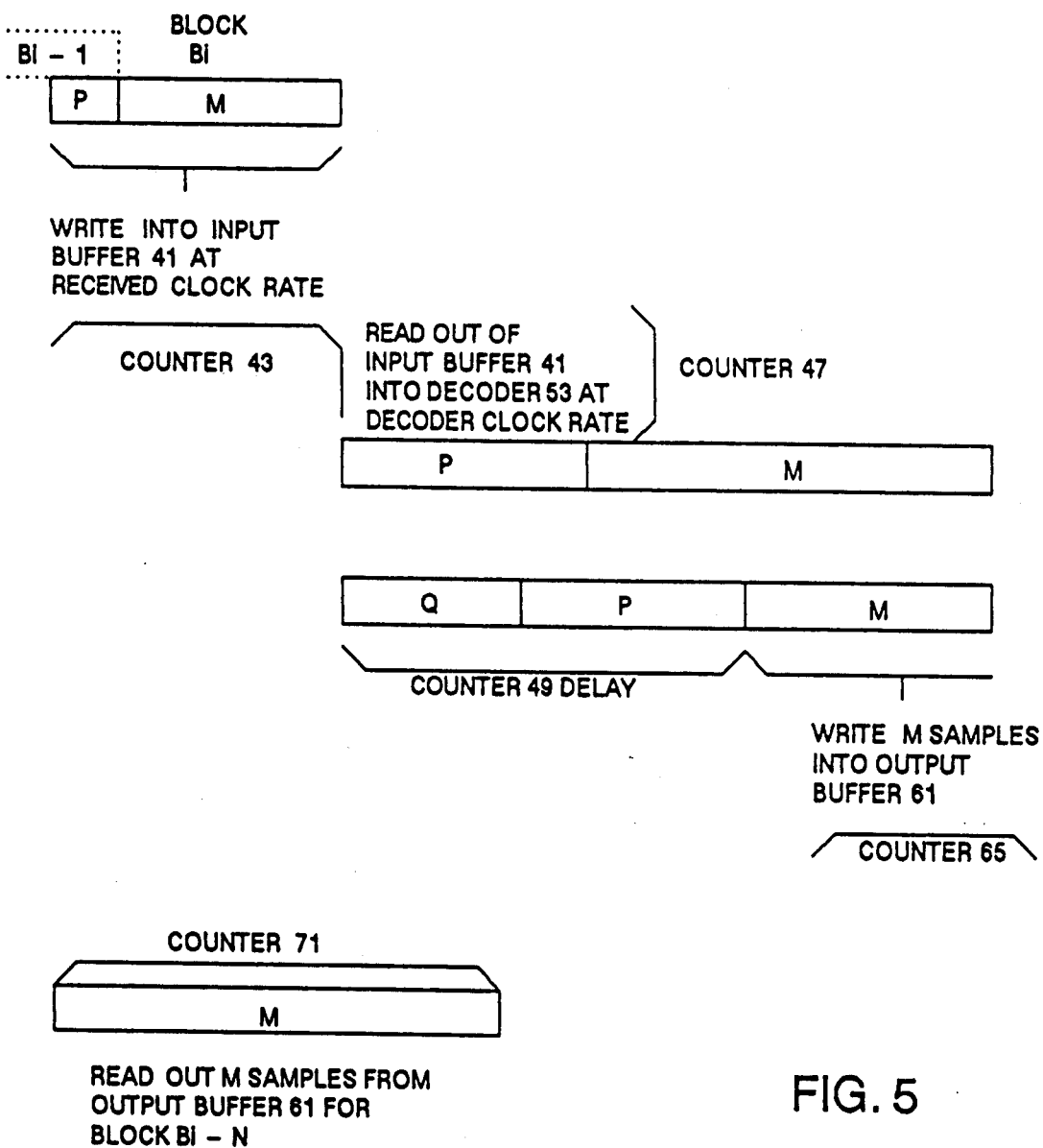
FIG. 5 is a timing/operation sequence diagram of the operation of a decoding signal processor.

The operation of the decoding signal processor may be understood by the timing/operation sequence diagram of FIG. 5, which shows a block of encoded data Bi comprised of P+M sample values, the first P samples of which overlap or correspond to the last P samples of an immediately preceding block Bi−1 and the next M samples of which are partially overlapped by the first P samples of an immediately succeeding block of data samples Bi+1. Under the control of a start sampling signal on link 38 from control unit 35, counter 43 is enabled and begins counting recovered clock signals on clock link 34. As it does so, counter 43 enables input buffer 41, so that it may read in or store data sample values of block Bi. The count capacity of counter 43 is such that it counts M+P clock signals and then disables itself and input buffer 41. During this counting interval the M+P data samples of which block Bi is comprised are written into input buffer 41.

The start sampling signal on link 38 is also coupled to counter 71, which begins counting from its preset value under the control of an output data clock supplied over link 73. During its count interval counter 71 enables the reading out of decoded data samples that have been previously stored in output buffer 61 for a previous block of data Bi−N, the decoded data being clocked out of buffer 61 at the output clock rate on link 73. Counter 71 counts M clock signals and then disables itself and output enable port of buffer 61.

Upon reaching its terminal count capacity counter 43 enables cascaded counter 47, so that counter 47 begins counting decoding clock signals supplied over clock link 37. During its count interval, counter 47 enables the reading out of the M+P encoded data samples that have been written into buffer 41, but at a read-out rate (the decoder clock rate) that is considerably reduced compared to the data rate at which the data was encoded. Upon reaching its count capacity counter 47 disables itself and the reading out of input buffer 41.

As noted previously, counter 49 is also enabled by clock 43 reaching its terminal count, namely upon the completion of the writing in of M+P encoded data samples into input buffer 41. Counter 49 is clocked at the decoder clock rate and has a count capacity corresponding to the block overlap (P samples) and the processing inherent delay (some number of Q samples) of decoder 53. Upon reaching its count capacity counter 49 disables itself and enables counter 65. During the count interval of counter 65, the state of link 67 enables output buffer 61, so that the decoded output data produced by decoder 53 may be written into buffer 61. The count capacity of counter 65 is such that output buffer loads M decoded data samples while it is enabled by counter 65. These M decoded data samples are subsequently read out under the control of the output data clock on link 73, in response to a start sampling signal on link 38 at the beginning of a time interval corresponding to the occurrence of encoded data block Bi+N.

Figure 6:
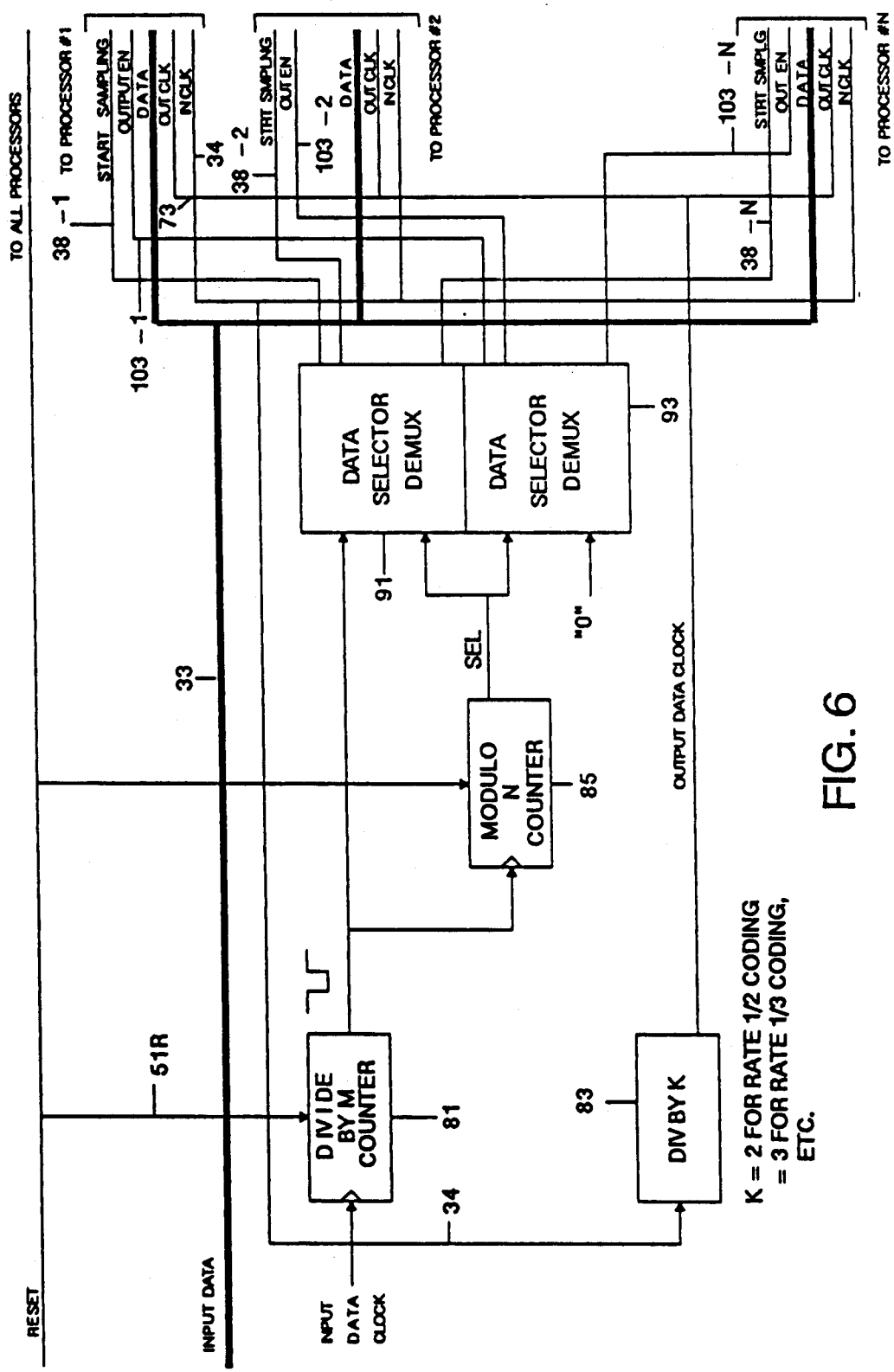
FIG. 6 diagrammatically illustrates the configuration of a control unit which supervises and synchronizes the operation of a plurality of decoding signal processors.

Referring now to FIG. 6, the configuration of control unit 35 which supervises and synchronizes the operation of respective decoder signal processors 31−1 . . . 31−N is shown as comprising a divide-by-M counter 81 and a divide-by-K counter 83, each of which is coupled to recovered clock link 34. The output of counter 81 is coupled to a modulo N counter 85, which serves to control the selectivity of a pair of data select demultiplexers 91 and 93 and thereby to which decoder signal processor a block of encoded data is to be supplied and from which decode signal processor buffered decoded output data is to be read out. Specifically, demultiplexer 91 supplies start sampling signals over links 38−1 . . . 38−N to counters 43 and 71, while demultiplexer 93 supplies output enable signals over links 103−1 . . . 103−N to driver 79 of each respective decoder signal processor (FIG. 4). A system reset signal is coupled over control link 37 R to all counters and buffer components of the multi-unit decoder.

Divider 83 divides the recovered clock signal by the encoding ratio (rate 1/K) of the host encoder used at the transmitter site, and thereby derives an output clock signal corresponding to the data rate of the original data prior to encoding. This output clock signal is coupled over link 73 to the output buffer 61 and read-out control counter 71 of each respective decoder signal processor 31.

Control unit 35 is essentially a synchronized scanning device sequentially enabling the operation of each of decoder signal processors 31−1 ... 31−N. Divide-by-M counter generates an output for every Mth recovered clock signal and thereby initiates the load and decode operation (causes demultiplexer 91 to produce an output on one of output links 101), and also enables the reading out of M buffered decoded data samples, that have been stored in the output buffer 61 of a respective decoder signal processor (as demultiplexer 93 produces respective output enable signals on links 103).

It should be noted that the overlapping of successive blocks of data is achieved by the operation of the counters within the decoders signal processors, not by the scanning operation of control unit 35, which synchronously steps through and enables the operation of each of processors 31 at a block rate of M samples per block. FIG. 2 illustrates the manner in which, even though there is an overlap of P samples, there is a time interval corresponding to exactly M encoded data samples between the start of each successive blocks B, (corresponding to the timing of start sampling signals produced by demultiplexer 91).

As will be appreciated from the foregoing description, the hardware and performance limitations of conventional high data rate forward error correction code encoding/decoding signal processing systems are reduced in accordance with the present invention by a signal processing mechanism that preserves the use of a high data rate encoder at the transmitter site, so that the input data may be continuously encoded and transmitted, while using low data rate decoders at the receiver site in such a manner that "end effects" are avoided and the sought-after performance of high data rate decoding is attained.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. For use with a communication system having a transmitter site whereat information signals are encoded at a first encoding rate and transmitted over a communication channel to a receiver site whereat encoded information signals that have been transmitted over said communication channel from said transmitter site are received, an apparatus for recovering said signals comprising:

a plurality of first means, each of which is coupled to receive said encoded information signals, for extracting, at a rate less than said encoding rate, a respective portion of said received encoded information signals that overlaps another portion of said information signals the time of occurrence of which is different from the time of occurrence of said respective portion; and second means for combining extracted portions of the received encoded information signals decoded by said plurality of second means and thereby producing output signals corresponding to said information signals; and wherein each first means includes first memory means for storing a respective sequential overlapping portion of said received encoded information signals, and decoding means, coupled to said first memory means, for decoding signals stored therein at a rate lower than said first rate at which said information signals are encoded at said transmitter site and producing therefrom a portion of said information signals; and wherein each of said first means includes means for writing said respective overlapping portion of said received encoded information signals into said first memory means at a rate corresponding to the data rate of said received signals, and for coupling the contents of said first memory means to said decoding means at a clock rate corresponding to said lower rate.

2. For use with a communication system having a transmitter site whereat information signals are encoded at a first encoding rate and transmitted over a communication channel to a receiver site whereat encoded information signals that have been transmitted over said communication channel from said transmitter site are received, an apparatus for recovering said signals comprising:

a plurality of first means, each of which is coupled to receive said encoded information signals, for extracting, at a rate less than encoding rate, a respective portion of said received encoded information signals that overlaps another portion of said information signals the time of occurrence of which is different from the time of occurrence of said respective portion; and second means for combining extracted portions of the received encoded information signals decoded by said plurality of second means and thereby producing output signals corresponding to said information signals; and wherein each first means includes first memory means for storing a respective sequential overlapping portion of said received encoded information signals, and decoding means, coupled to said first memory means, for decoding signals stored therein at a rate lower than said first rate at which said information signals are encoded at said transmitter site and producing therefrom a portion of said information signals; and wherein each of said first means further includes second memory means, coupled to said decoding means, for storing said portion of said information signals, and wherein said second means includes means for reading out said portion of said information signals stored in said second memory means; and wherein each of said first means include means for writing decoded signals from said decoding means into said second memory means at said lower rate and for reading out the contents of said second memory means at a clock rate corresponding tot he clock rate of said original information signals.

3. An apparatus according to claim 2, wherein each of said first means further includes second memory means, coupled to said decoding means, for storing said portion of said information signals, and wherein said second means includes means for reading out said portion of said information signals stored in said second memory means.

4. An apparatus according to claim 3, wherein each of said first means include means for writing decoded signals from said decoding means into said second memory means at said lower rate and for reading out the contents of said second memory means at a clock rate corresponding to the clock rate of said original information signals.

5. For use with a digital communication system having a transmitter site whereat digital information signals are encoded by an encoder at a first encoding rate and transmitted over a communication channel to a receiver site whereat encoded digital information signals that have been transmitted over said communication channel from said transmitter site are received, an apparatus for recovering said signals:

a plurality of sampling means, each of which is coupled to received said encoded digital information signals, for sampling, at a rate less than said encoding rate, a respective portion of said received encoded digital information signals that overlaps another portion of said encoded digital information signals the time of occurrence of which is different from the time of occurrence of said respective portion; and output means for combining respective portions of the received encoded digital information signals sampled by said plurality of sampling means and thereby producing digital output signals corresponding to said digital information signals; and wherein each sampling means includes first memory means for storing a respective sequential overlapping portion of said received encoded digital information signals, and a decoder, coupled to said first memory means, for decoding signals stored therein at a rate lower than said first rate at which said digital information signals are encoded at said transmitter site and producing therefrom a portion of said digital information signals, and further including means for writing said respective overlapping portion of said received encoded digital information signals into said first memory means at a rate corresponding to the data rate of said received signals, and for coupling the contents of said first memory means to said decoder at a clock rate corresponding to said lower rate.

6. For use with a digital communication system having a transmitter site whereat digital information signals are encoded by an encoder at a first encoding rate and transmitted over a communication channel to a receiver site whereat encoded digital information signals that have been transmitted over said communication channel from said transmitter site are received, an apparatus for recovering said signals:

a plurality of sampling means, each of which is coupled to receive said encoded digital information signals, for sampling, at a rate less than said encoding rate, a respective portion of said received encoded digital information signals that overlaps another portion of said encoded digital information signals the time of occurrence of which is different from the time of occurrence of said respective portion; and output means for combining respective portions of the received encoded digital information signals sampled by said plurality of sampling means and thereby producing digital output signals corresponding to said digital information signals, and wherein each sampling means includes first memory means for storing a respective sequential overlapping portion of said received encoded digital information signals, and a decoder, coupled to said first memory means, for decoding signals stored therein at a rate lower than said first rate at which said digital information signals are encoded at said transmitter site and producing therefrom a portion of said digital information signals, and wherein said means further includes second memory means, coupled to said decoder, for storing said portion of said information signals, and including means for reading out said portion of said digital information signals stored in said second memory means, and further including means for writing decoded signals from said decoder into said second memory means at said lower rate and for reading out the contents of said second memory means at a clock rate corresponding to the clock rate of said original digital information signals.

7. For use with a digital communication system having a transmitter site whereat digital information signals are encoded by an encoder at a first encoding rate and transmitted over a communication channel to a receiver site whereat encoded digital information signals that have been transmitted over said communication channel from said transmitter site are received, an apparatus for recovering said signals:

a plurality of sampling means, each of which is coupled to receive said encoded digital information signals, for sampling, at a rate less than said encoding rate, a respective portion of said received encoded digital information signals that overlaps another portion of said encoded digital information signals the time of occurrence of which is different from the time of occurrence of said respective portion; and output means for combining respective portions of the received encoded digital information signals sampled by said plurality of sampling means and thereby producing digital output signals corresponding to said digital information signals; and wherein each sampling means includes first memory means for storing a respective sequential overlapping portion of said received encoded digital information signals, and a decoder, coupled to said first memory means, for decoding signals stored therein at a rate lower than said first rate at which said digital information signals are encoded at said transmitter site and producing therefrom a portion of said digital information signals, further including means for writing said respective overlapping portion of said received encoded digital information signals into said first memory means at a rate corresponding to the data rate of said received signals, and for coupling the contents of said first memory means to said decoder at a clock rate corresponding to said lower rate, and wherein said decoding means further includes second memory means, coupled to said decoder, for storing said portion of said digital information signals, and including means for reading out said portion of said digital information signals stored in said second memory means.

8. An apparatus according to claim 7, including means for writing decoded signals from said decoder into said second memory means at said lower rate and for reading out the contents of said second memory means at a clock rate corresponding to the clock rate of said original digital information signals.

9. For use with a communication system having a transmitter site whereat information signals are encoded at a first encoding rate and transmitted over a communication channel to a receiver site whereat encoded information signals that have been transmitted over said communication channel from said transmitter site are received, a method for recovering information signals from said received signals comprising the steps of:
   (a) coupling respective overlapping portions of said encoded information signals to a plurality of sampling means, each of which has a sampling rate less than said encoding rate, and thereby extracts a respective portion of said received encoded information signals that overlaps another portion of said information signals the time of occurrence of which is different from the time of occurrence of said respective portion; and
   (b) combining extracted portions of the received encoded information signals extracted in step (a) by said plurality of sampling means and thereby producing output signals corresponding to said information signals, and wherein
   step (a) includes storing, in a first memory, a respective sequential overlapping portion of said received encoded information signals and extracting signals stored therein at a rate lower than said first rate at which said information signals are encoded at said transmitter site and producing therefrom a portion of said information signals, and
   writing said respective overlapping portion of said received encoded information signals into said first memory at a rate corresponding to the data rate of said received signals, and coupling the contents of said first memory to a decoder at a clock rate corresponding to said lower rate.

10. For use with a communication system having a transmitter site whereat information signals are encoded at a first encoding rate and transmitted over a communication channel to a receiver site whereat encoded information signals that have been transmitted over said communication channel from said transmitter site are received, a method for recovering information signals from said received signals comprising the steps of:
    (a) coupling respective overlapping portions of said encoded information signals to a plurality of sampling means, each of which has a sampling rate less than said encoding rate, and thereby extracts a respective portion of said received encoded information signals that overlaps another portion of said information signals the time of occurrence of which is different from the time of occurrence of said respective portion; and
    (b) combining extracted portions of the received encoded information signals extracted in step (a) by said plurality of sampling means and thereby producing output signals corresponding to said information signals, and wherein
    step (a) includes storing, in a first memory, a respective sequential overlapping portion of said received encoded information signals and extracting signals stored therein at a rate lower than said first rate at which said information signals are encoded at said transmitter site and producing therefrom a portion of said information signals, storing in a second memory, said portion of said information signals, and further including reading out said portion of said information signals stored in second memory, and writing extracted signals into said second memory at said lower rate and for reading out the contents of said second memory at a clock rate corresponding to the clock rate of said original information signals.

* * * * *